United States Patent [19]

Koslar

[11] Patent Number: 4,906,916
[45] Date of Patent: Mar. 6, 1990

[54] SIGNAL PROCESSING DEVICE HAVING HIGH SPEED SHIFT REGISTER

[75] Inventor: Manfred Koslar, Berlin, Fed. Rep. of Germany

[73] Assignee: CREATEC Gesellschaft für Elektrotechnik mbH, Berlin, Fed. Rep. of Germany

[21] Appl. No.: 356,501

[22] Filed: May 23, 1989

Related U.S. Application Data

[63] Continuation of Ser. No. 946,047, filed as PCT DE86/00144 on Mar. 27, 1986, published as WO86/05885 on Oct. 9, 1986, abandoned.

[30] Foreign Application Priority Data

Mar. 27, 1985 [DE] Fed. Rep. of Germany ....... 3511592
Mar. 27, 1986 [WO] PCT Int'l Appl. ... PCT/DE86/00144

[51] Int. Cl.$^4$ ...................... G01R 13/00; G01R 15/08
[52] U.S. Cl. .................. 324/121 R; 324/115; 364/487
[58] Field of Search ...................... 324/121 R, 115, 97, 324/99 D; 364/487; 340/720, 799; 315/367, 370

[56] References Cited

U.S. PATENT DOCUMENTS

| | | | |
|---|---|---|---|
| 3,678,505 | 7/1972 | Mostyn, Jr. .................. | 324/99 D X |
| 3,790,886 | 2/1974 | Kurtin et al. ................. | 324/95 D X |
| 4,251,754 | 2/1981 | Navarro et al. ............... | 315/370 |
| 4,390,864 | 6/1983 | Ormond ........................ | 324/99 D X |
| 4,455,613 | 6/1984 | Shoemaker ..................... | 364/487 X |
| 4,495,586 | 1/1985 | Andrews ........................ | 315/367 X |
| 4,555,765 | 11/1985 | Crooke et al. ................ | 324/121 R |
| 4,647,862 | 3/1987 | Blair ........................... | 364/487 |

FOREIGN PATENT DOCUMENTS

327139 3/1984 Fed. Rep. of Germany.
338381 5/1984 Fed. Rep. of Germany.

*Primary Examiner*—Ernest F. Karlsen
*Assistant Examiner*—Vinh P. Nguyen
*Attorney, Agent, or Firm*—Spencer & Frank

[57] ABSTRACT

A signal processing device having at least one input for analog input signals and one shift register or a corresponding data memory, an analog/digital converter and a processor for processing the digital signal train forming the output signal of the analog/digital converter, the signal train representing the signal course - which is preferably to be displayed in a display field - wherein the shift register is embodied as a digitally operating high-speed shift register or RAM and is connected to the output side of the analog/digital converter, in particular directly or with a data buffer interposed between them.

18 Claims, 5 Drawing Sheets

SIGNAL PROCESSING DEVICE HAVING HIGH SPEED SHIFT REGISTER

This application is a continuation of application Ser. No. 06/946,047, filed as PCT DE86/00144 on Mar. 27, 1986, published as WO86/05885 on Oct. 9, 1986, now abandoned.

BACKGROUND OF THE INVENTION

The invention relates to a signal processing device having an analogue input, a shift register or data memory, and A/D converter, and a processor producing a signal course to be displayed, as preferably used as a digital memory oscillograph, among other uses.

A digital memory oscillograph is used to display waveforms. An analog signal is digitized. The digital data are stored for the ensuing display of the analog waveform or for a calculation by means of a digital processor ($\mu P$).

Digital memory oscillographs of this type are becoming increasingly important because with them unique features, such as pre- and post-triggering, an arbitrarily long storage time and various kinds of signal processing, that are unattainable with conventional oscillographs that operate in real time, become possible. These features, in combination with advanced digital technology, make it possible to increase the scanning speed and reduce the memory capacity.

In this connections, provisions are also known that use integrated circuits and large-scale-integration (LSI) technology and have analog memories for high speeds, for instance CCD (charge coupled device) circuits, as analog shift registers. German patent disclosure document DE-OS 33 38 381 discloses an improved memory oscillograph that includes this kind of analog shift register. The disadvantage in the use of CCD circuits, however, is that these memories are incapable of functioning independently of the time base selected. The above-mentioned document accordingly describes an oscillograph that functions in a plurality of different operating modes in accordance with the setting of the time base. This kind of provision is unnecessarily expensive, however, and for the most part it cancels out the advantages generally attainable with digital processing.

The problems presented here can be described as follows:

Digital oscillographs acquire electrical signals by quantizing scanned values, which are recorded at separate time intervals and subsequently are entered in quantized form into a memory for later display as a regenerated wave form. Initially the apparent band width of digital oscillographs was limited, because all the scanned values that belong to one waveform had to be recorded in succession, each in a single period of the signal having the scanning clock frequency. The reason for this was the asynchronous relationship between the triggering event and the scanning clock rate. In the field of digital oscillographs, this mode of operation is known as acquisition once per clocking.

In a mode of operation with signal acquistion similar to the chronologically equivalent random sampling acquisition, the apparent band width of signal acquisition was expanded considerably. In this mode, locations in the various periods of a repeating signal are detected, and a single chronologically equivalent period of the signal is reestablished from these locations, although the waveform scanning values over the course of many periods can be recorded separately from one another. One problem associated with this kind of chronologically equivalent waveform regeneration is that it takes a relatively long time to detect all the relevant scanning values, displaying the various data points.

Another problem is that the trigger point, which is the same in all successive periods of the signal, and the scanning cycle, which has a predetermined fixed frequency, are not matched to one another. As a result, the data points shown exhibit a horizontal fluttering relative to one another. This problem has been addressed in U.S. Pat. No. 4,251,754 of Luis J. Navarro and Thomas P. Dagostino. It is explained in this patent that the fluttering caused by the indefiniteness of scanning can be corrected by measuring the time interval between a trigger recognition event (which occurs when the signal potential passes through a selectable threshold value) and the next subsequent scanning clock pulse and by using the measured value to generate an offset current in the horizontal displaying system; as a result of this correction, each frame of the display is shifted horizontally. In this process, every scanning value represented is put into its precise chronological location. This solution of the fluttering problem is not, however, suitable for waveform processing with a computer or the like that takes place in the meantime, because the correction takes place only in the displaying system.

Another aspect in chronologically equivalent waveform regeneration is the influence of the lower Nyquist threshold on the scanning frequency of the periodic scanning. If the scanning frequency is less than twice the frequency of the input signal, then data is lost because there are too few scans. Under some circumstances, the result may be a waveform displayed in distorted form. It was accordingly desirable both to obtain numerous scanning values for each trigger recognition and to provide for the precise chronologically equivalent location of each scanned data point in the acquisition process.

In this connection, from German patent disclosure document DE-OS 33 27 139, a method for detecting a chronologically equivalent waveform during a great number of periods of a repeating input signal is known, in which one or more scanning values are detected from each period of the many periods at separate intervals of one scanning clock rate; the chronological difference between a fixed point in each period and the next successive clock pulse is measured; from the measured chronological difference a memory address is determined for each scanning value; and the scanning values are stored in the memory at the address calculated.

This method is again very complicated and with it, a signal course cannot be displayed on the screen until some time after its appearance at the input of the oscillograph, because the above-described signal processing takes a certain amount of time. This is particularly annoying because it involves events that already elapse relatively slowly.

SUMMARY OF THE INVENTION

The object of the invention is to embody a signal processing device, and in particular a digital memory oscillograph, of the generic type described at the outset such that it enables uniform signal processing regardless of the time base selected, both for events that elapse vary rapidly and those that elapse slowly.

The invention has the advantage that while in a digital signal processing device, which further processes the analog input signal digitizing should take place immediately after the analog signal input, so that all the manipulations and control can be performed inside the digital portion without further digital/analog conversions.

By using a shift register as a buffer memory, with a controller separate from the microprocessor that performs the digital processing at the output of the shift register, there is the additional advantage that only a simple clock control is required for high-speed signal processing.

If the demand for signal processing speed at the input is not very stringent, that is, in processing signals having solely relatively low-frequency components the shift register is driven at a correspondingly lower clock frequency, and there is enough time between the clock pulses to deliver the individual signals for further processing by the following processor circuit. With very high-frequency input signals, the signal recorded for one signal train takes place in a closed manner, and the readout for further processing by the following microprocessor having a lower speed can take place between the signal recording cycles at a slowed-down speed. Because a display device that contains its own signal memory is used, a frame change can take place at chronological intervals, and this is entirely adequate for performing, at intervals, the processing required for the contents of the next frame to be displayed.

Because the digital signal values to be written into the shift register are monitored by a comparator, and when a predetermined agreement arrives a preprogrammed signal processing is done, taking into consideration a counter state displaying the clock number of signals previously recorded in the shift register, there is very great freedom in the processing that is done in the signal processing portion that follows the shift register. In accordance with predetermined events, to be recognized by the "digital trigger", the display of the recorded signal train on the screen is preferentially varied, and by means of externally variable selection means, it is possible to specify the geometric position in which a predetermined event should appear on the screen. In order to furnish complete freedom in terms of the use of a "PRE-" and "POST-" trigger, the screen memory favorably has twice the memory capacity of the shift register.

By preprogramming of predetermined processing functions, a "stretching" of the signal display can be obtained for specified ranges of the signal representation, by intermittently raising the clock frequency of the shift register. Moreover, by means of the "digital trigger", switchover operations are advantageously performed between the two signal processing channels, in such a manner that portions of the appearing signals, with single channel processing, appear in the display field for a second channel that can be used for another purpose.

In another preferred embodiment of the invention, the scanning frequency of the input signal can be increased during digitization by providing that each of the flash converters of the two processing channels furnishes signals in alternation for one and the same signal train.

BRIEF DESCRIPTION OF THE DRAWINGS

Advantageous further embodiments of the invention will be described below in further detail in the course of the description of the preferred embodiment of the invention, taken in conjunction with the drawings. Shown are:

FIG. 3, a block circuit diagram of a conversion processor, as a further detail of the exemplary embodiment of FIG. 1.

DETAILED DESCRIPTION OF THE PREFERRED EMBODIMENTS

Figure 1:
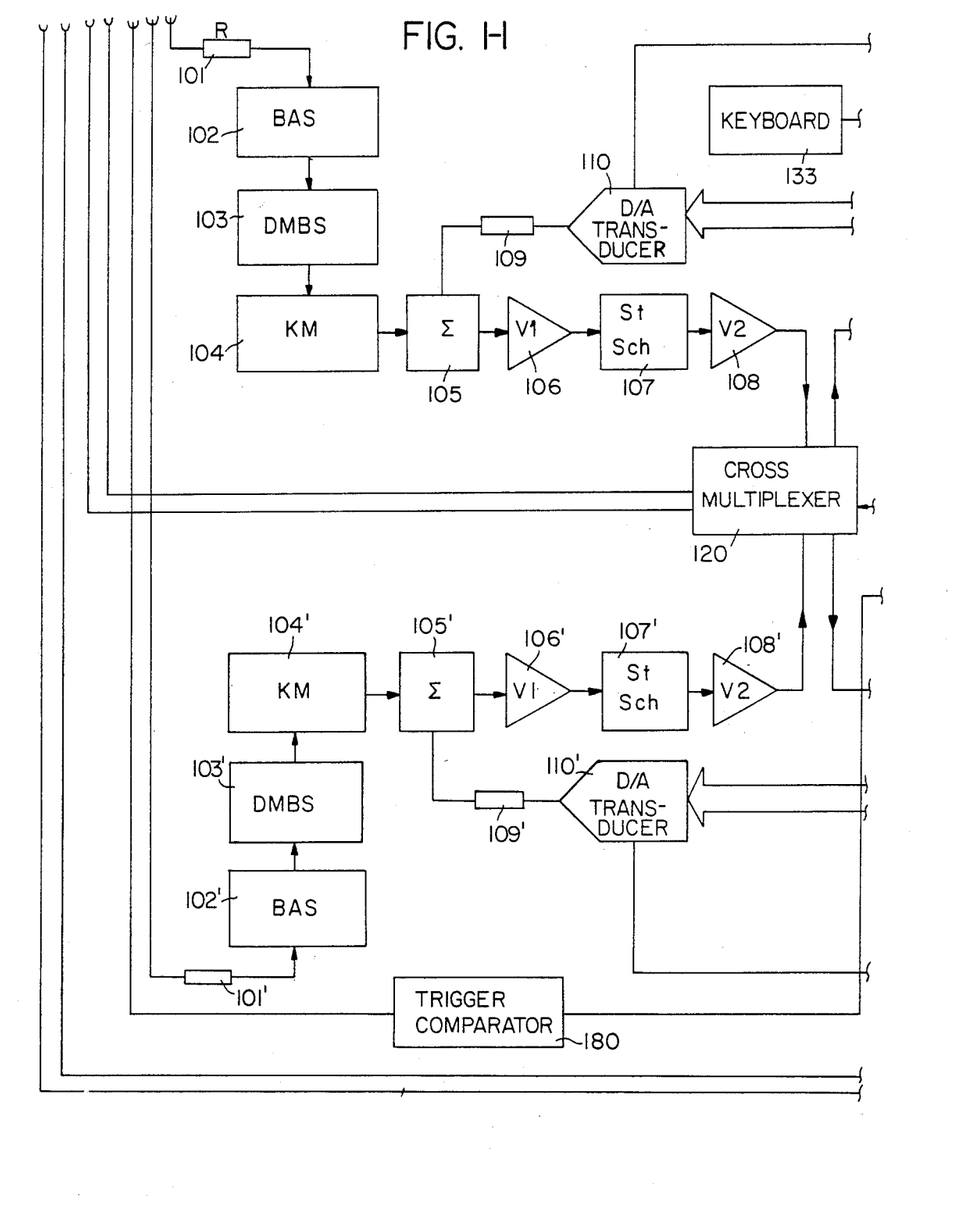
FIG. 1, a preferred exemplary embodiment in the form of a block circuit diagram.

In the block circuit diagram shown in FIG. 1, the plug-in input and program module is outlined in dot-dash lines. The upper program module is connected directly, with its data plug connections in the form of digital inputs, with a multiplexer circuit 120, while the input contact terminals for oscillograph operation 5, 15 are connected with the corresponding oscillograph input circuit means when this module is in use. Output lines (pulse and function generators) also lead to the outside for further modules (not shown), so that by simply replacing modules other types of measuring instruments are attainable. The other component assemblies shown will be described below in this context:

The component assemblies 101–108 to be described below are numbered in the order of signal processing; that is, the input signal of the preceding stage is delivered to the next stage in succession. The two input channels are symmetrical in design, and so the corresponding component assemblies for the other channel need not be described separately. They are identified by the same reference numerals, with a prime (').

The Operating Mode Switch (BAS) 102

The analog input signal is delivered via a high-resistance protective safety resistor 101 to the operating mode switch 102. The operating mode switch enables the selection of the direct voltage coupling (DC), the alternating voltage coupling (AC), and the position "input short-circuited (GROUND)", via a mechanical slide switch.

At the same time, the device can be switched on or off via this switch, via the switch position "OFF". The operating mode switch 102 contains a mechanically parallel-connected encoding switch, which reports the switch position at any given time to the microcomputer to be described below.

The Decade Measuring Range Switch (DMBS) 103

In addition to operating mode switch 102, there is also one measuring range switch per channel in the device; this switch enables adapting the signal amplitude to the level ratios of the other stages. The measuring range switch (MBS) comprises four main parts. It is embodied by an 11-step multiple-plane slide switch, the first part of which is the decade measuring range switch (DMBS) 103. It serves to perform amplification and attenuation of the input signals at a summing point via resistor networks that are variable by means of the switch.

The Calibration Multiplexer (KM) 104

With the aid of the calibration multiplexer 104, the analog signal input E1 can be separated from the summing point 105, and a direct voltage signal can be delivered, under the control of the main microcomputer 140 via the D/A converter 110, to the summing point 105 via the resistor R109; this signal is supplied to the summing point S and stored in memory at the input of the amplifier chain, passes through the entire amplifier chain, and via the flash A/D converter system 131 is returned to the main microcomputer 140 for evaluation as a digital signal. Since the main microcomputer has generated the set point signals itself, it can store the arriving actual signals in a calibration table and thus, in the ensuing measuring operation, in which the calibration multiplexer 104 switches the signal source back on, can perform a correction if necessary in evaluating the arriving actual signals in accordance with the stored correction table.

The Summing Point 105

With the summing point S, versatility can be influenced decisively, and virtually ideal system-analytic advantages are attained. It is embodied by the summing point of a potentiometrically wired direct voltage broad band amplifier. At this summing point, the direct voltage signals coming from the D/A converter can be incorporated for automatic null drift correction and autocalibration. At the same time, it serves as a virtual ground for the calibration circuit connected through the decade measuring range switch.

The High-Resistance Measuring Preamplifier (V1) 106

The measuring preamplifier 106 is embodied by a push-pull bridge amplifier, constructed of discrete semiconductor components, and together with the potentiometrically wired calibration divider constructed as a current divider it raises the level of the input signals.

In this manner, it divides the calibration circuit, which enables a decade-type stratification of the overall amplification of 5-fold, 0.5-fold, 0.05-fold, from the step switch 107 connected to the output side of the amplifier V1.

The Step Switch (StSch) 107

To enable control over the great number of measuring ranges without excessive complexity in the high-resistance portion of the input circuit embodied as a calibration circuit, the decade components in the eleven individual measuring range steps are performed by the decade measuring range switch 103. In the intervening level adapter circuits 1, 0.5, 0.2, this additional division is performed by the first separating amplifier 106, because here a low-resistance source is already available, and so the step dividers that are selected by means of the step switch 107 do not require compensating capacitors. The step switch is accordingly connected between the measuring preamplifier V1 and the measuring amplifier V2 108, and enables attenuations of 1, 0.4 and 0.2. A further plane of the step slide switch is moved parallel to the step switch 107, and this plane adapts the direct voltage output signals generated by the D/A converter to the voltage (or current) level required for the particular step switch position at the input of the summing point.

The Measuring Amplifier (V2) 108

A broad band measuring amplifier 108 is in turn connected to the output side of the step switch, and it amplifies the entire level in accordance with the requirements of the level window located at the input of the parallel A/D converter. This level window has a width of approximately 2.5 V. It is designed in accordance with the same principles as the measuring preamplifier 106.

The Cross-Channel Multiplexer 120

The cross-channel multiplexer 120 is supplied at its inputs with the output signals of two channel amplifiers of the above-described type. It permits furnishing the two input channels, under the control of the main microcomputer 140, in time multiplexing to one or two analog/digital converter systems, either parallel or crosswise. This makes a number of different system configurations possible. In this way, via the cross-channel multiplexer 120, either two parallel channels including the A/D conversion can be provided, or only one A/D converter can be used, in a chopper or alternate mode.

The Parallel Analog/Digital Converter (Flash ADC) 131

In order to evaluate the signals with a large band width, a parallel analog/digital converter 131 having the highest possible sampling rate must be used. These so-called flash converters are embodied at the input by parallel-connected chains, quantized via a reference voltage divider, of high-speed comparators. At the sampling instant, each of the comparators (256 comparators, in an 8-bit converter) of which the voltage has just exceeded or dropped below their reference voltage value performs the signal recognition. Encoding circuits connected to the output side of the comparators furnish the recognized digital value, for instance in an 8-bit-wide binary encoding, to the output of the analog/digital converter at the clock rate of the sampling frequency.

The Conversion Processor 130

Since the analog signals may have different band widths, and for displaying the analog signals in the digital range may also require different time-base sweeps or different time-base resolutions, it is recommended that the analog signals not always be interrogated at the highest possible sampling rate. The pulse train frequency of the interrogation pulses must therefore be embodied to suit the particular selection specification involved. This task, among others, is performed by the conversion processor 130. An on-board oscillator picks up the time standard, in this case in the form of a 40 MHz vibration, from a quartz crystal. From this 40 MHz vibration, the 20 MHz wide scanning pulse having a pulse length of 25 ns can be derived, and thus represents the chronological duration of the sampling. With the aid of counters that are settable via the status memory, the sampling rate is then stepped down by the sampling select rate, depending on the operating mode, and the samples of the 8-bit-wide signal picked up intermittently in this way are delivered to the following shift register 132. A digital amplitude comparator is also located in the conversion processor 130 and enables selection of the arriving digital signals in accordance with amplitude criteria. In terms of systems theory it is of interest that the conversion processor 130 makes it possible, in accordance with the specifications in its status memory, to select digital signals in accordance with amplitude and time in combination with a flash converter that it controls. Electrical information that is initially present in the analog range is thus quantized in the amplitude and time range. The system thus makes it possible to decompose information point by point in a preselected manner— which is a very decisive feature from the standpoint which is a very decisive feature from the standpoint of systems of systems theory.

The conversion processor 130 also includes a number of other functional units, for instance generators for the shift pulses and shift control signals for a high-speed shift register 132 connected to its output side, generating means for the various multiplex signals, and a settable pulse generator. The conversion processor 130 is also embodied such that not only does it drive a flash converter and a shift register, but it can also drive a second system of such components (see the circuit diagram) 160 independently of the first such system.

High-Speed Shift Register 132

The shift register for the high-speed signals is a essential component of the system. In high-speed conversion of analog signals, the digital signals arrive at the sampling rate, which may be greater than 100 MHz. At this speed, they can no longer be processed by even the fastest microcomputers, such as bit slicers. Accordingly, a time interface is favorable, in the form of a shift register. Normally, multiplex random access memories would be used here; however, they require addressing via transparent counters, and this means additional expense in terms of time and components. A high-speed shift register 132 is an optimal systems solution here, because the shift register can be written into quickly and read out more slowly in accordance with the time capabilities of the processor doing the processing. If this shift register is constructed using high-speed CMOS technology, it affords the further advantage, given the intermittent operating mode that the system necessarily requires, of using almost no current during the waiting intervals, despite its high speed. This means that when high-speed CMOS shift registers are used the consumption of current is disproportionately lower than with ECL integrated circuits—despite the high frequency with which data is written into it. If the shift register is provided with tristate outputs at its output, then it can be connected directly to the system bus. The flash ADC, conversion processor 130 and high-speed shift register 132 form a systems unit, and especially if they are accommodated on a single chip using $1\mu$ CMOS technology, they represent a new type of microcomputer, one that, as a very universally usable systems component, is suitable for connecting our analog environment with the world of digital data processing.

The Main Microcomputer 140, Its Memories and the Peripherals

Connected to the system bus is, first, the microcomputer 140 —here, by way of example, an 8-bit multi-I/O microcomputer with on-board RAM, ROM and oscillator and timer input with serial interface and special commands and command processing cycles, the majority of which are at 1 $\mu$s.

The main microcomputer serves as the central computer, so that all the commands arriving from the keyboard 133 are suitably processed to its internal, or external, program memory 142, the signals presented by the high-speed register 132 are read out, and these signals are evaluated in accordance with the most varied specifications, converted, stored in the data memory 141, compared with other signals, analyzed, and finally sent, ready for display and for interfacing, to a screen or graphics processor 145, printer 143 or the function generator output interface 170 or other interface processors 144 via the BUS.

The software for this can perform a great variety of different evaluations and analyses of the initially analog signals and can furnish them to the most various peripherals having different kinds of display.

The Matrix LCD Graphics Processor 145, the LCD 146 and the Picture Memory 147

The graphics processor for the matrix liquid crystal display, which is driven by the multiplexing method, is an interface processor of a special kind. To prevent unduly straining the main microcomputer with the complicated management of a matrix LCD, it was necessary to develop a special microprocessor. This makes it possible, in bidirectional bus operation, to present one of the picture RAMs at a time for writing data in accordance with the time capabilities of the main microprocessor, while the special processor uses the pixels of the matrix LCD of the other picture RAM. In this way, it was possible for the picture change to be completed within a period of time that is imperceptible to the beholder. The special processor also furnishes all the signals necessary for triggering the LCDs: the serial picture data signals, the point shift clock signal, the line-end clock signal, the picture starting clock signal and the clock signal for changing the algebraic sign ($\pm$) of the picture voltage. Moreover, all the pixel conjunction operating modes, such as EXOR, AND, OR and inversion between the two picture memory contents can be performed; and finally, blinking functions can be generated via software or hardware. The special processor has a status memory, to enable preprogramming of operating modes, such as different multiplexing rates for matrix LCDs having different pixel complexity and different picture control organization.

The Keyboard 133 and the Keyboard Processor 134

The keyboard 133 serves to input various command sequences for controlling the entire device, and here it is preferably embodied as a touch pad.

Via a matrix, it controls the inputs of the keyboard processor 134, which is embodied here as a multi-I/O 4-bit microcomputer. Via additional inputs, this processor also receives the status report for the various switch positions of the BAS and MBS, so as to pass along keyboard command trains and switch position reports via its bus, after a suitable interrupt in the handshaking mode. Via its timer outputs, the keyboard processor also generates the signals for operating a buzzer, which provides acoustical feedback between the keyboard and computer, on the one hand, and the person using the equipment, on the other.

The Function Generator 170

An important function element of a signal computer is the function generator 170, which is connected via a further separate output. It makes it possible to prepare various signals by program or to write signals previously picked up and now located in memory into a high-speed shift register 149 via a multiplexer 148, so that the signals can then be sent to the outside in the form of an analog signal, via a high-speed digital converter 150 and corresponding separating stages.

This affords additional versatility. Besides the fact that a function generator is designed for arbitrary signal forms that can be adjusted by program, for example forms that are derived from a mathematical equation or those that have already been previously picked up or have just now been picked up, the system is also usable as a four-pole analyzer, which is self-calibrating from output to input and in the wobble mode can be equipped with the ability to perform selective filtering and to carry out auto correlation analysis programs independently and in accordance with the results.

The Trigger Comparator 180

While the system by its structure has a purely digital trigger, which is programmable by amplitude and time in both signal channels and which is attained because of the important fact that no memories—such as charge-coupled devices—are used in the analog portion but instead, in the conversion processor or in other words in the digital portion there is a built-in amplitude comparator for the 8-bit signal, virtually jitter-free digital triggering, and a genuine fully-automatic trigger, are possible. In addition, the device also has an external trigger input, the triggering threshold of which is either set in a fixed manner at an analog comparator (for example at TTL level), or could be set by program via a DAC.

By exchanging program parts and/or connecting elements, it is thus possible for the function of the device according to the invention to be changed completely and adapted to various measuring tasks. This property is due particularly to the fact that the electrical signal processing portion is designed such that it can not only receive signals and display them graphically in the same chronological sequence, but also synthesize random signal courses, which are delivered to testers, so that the reaction of the system to be tested can be observed directly and displayed on the screen. When it is used as a logic analyzer, the event-controlled trigger, after recognition of a predetermined input signal, manipulates the signal stored in the shift register in accordance with a specified program, so that without further provision, means for signal analysis can also be implemented.

Examples of types of equipment that can be produced in this manner include the following: universal measuring instrument, oscilloscope, interface tester, memory oscillograph, transient recorder, logic analyzer, frequency analyzer, measuring generator, wobble generator, voltmeter, performance meter, sound level meters, autocorrelators, and ratiometric measuring bridges. The operational behavior of the device and hence its generic type are determined by how the interface module is embodied and by the existing terminal elements or connections to input and output terminals, as well as by how program parts are embodied.

Figure 2:
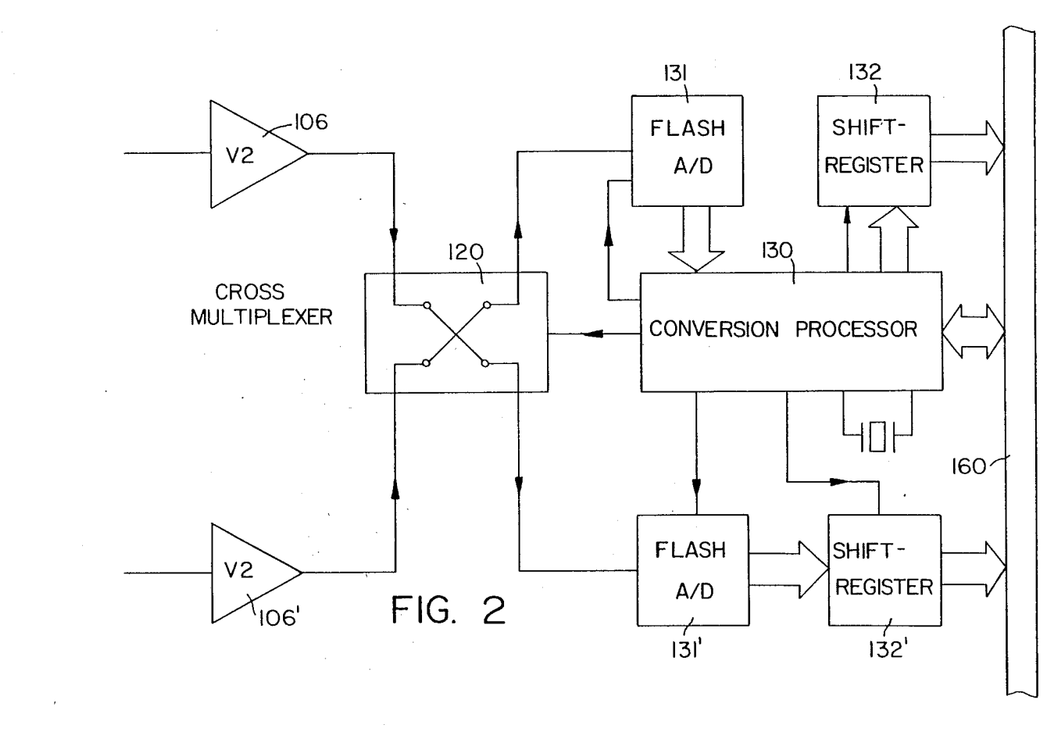
FIG. 2, a block circuit diagram of a cross multiplexer as a detail of the exemplary embodiment of FIG. 1.

Details of the conversion processor and of the components around it will also be described, referring to FIGS. 2 and 3.

In FIG. 2, the cross-channel multiplexer 120 for operating the signal processing device as a digital oscilloscope is shown separately along with the components around it. The reference numerals are equivalent to those of FIG. 1. It is apparent that the cross-channel multiplexer, by internal reversal of the data connection routes, can furnish the output signals of both input amplifiers 106 and 106' separately to the two signal processing channels 131 and 131', or furnishes the input signals of one channel to both flash converters; as a result, by alternating clocking, the time resolution of the input signal can be doubled. The input signals of both amplifiers 106 and 106' can also be superimposed on one another.

FIG. 3 shows the internal organization of the conversion processor 130. The data fed in by the flash converter 131 reach the input of a data buffer 301, which temporarily stores the data records that are sent on to the shift register 132. The conversion processor has an independent oscillator 302 with a quartz crystal, the output clock 1 of which can be scaled down by a programmable prescaler 303, also taking the clock of the external system into consideration. The output signal of the programmable prescaler forms the clock 2, which in turn triggers the programmable time control 304, which embodies the central control unit for chronological signal processing within the conversion processor.

Both the programmable prescaler 303 and the programmable time control 304 communicate via an interface 305 with the system 160, which cooperates with the main microprocessor and its peripherals. The control of the programmable components of the conversion processor 130 is thus accomplished by the input of data words via the system bus 160, and the programmable component assemblies are selectable via separate addresses.

By means of the programmable time control 304 through the data selection pulse (SSP), not only the data buffer 301 for the selection of the individual digital data records at the output of the analog/digital converter 131, but a programmable digital comparator 306, which compares the data stored by the data buffer 301 with predetermined data that were provided to it by the system bus 160 via the interface 305, are synchronized. The triggering of the digital/analog converters 131 and 131' and the clocking of the shift registers 132 and 132' are also effected by means of signals derived from the central time control (sample selection outputs of the programmable time control 304) in synchronism with the data selection pulses.

The programmable digital comparator 306, by comparing the entering digital data with the preprogrammed data value, recognizes the triggering instant and thereupon emits a corresponding signal, which is also available for external use. For the external trigger, the digital comparator 306 is also provided with the signals from the trigger comparator 160, which likewise fix the triggering instant.

The output signal of the digital comparator 306 also reaches a programmable dual time base 307 having a trigger position counter, which includes a counter that is started with the trigger pulse and is set forward each time via incoming data selection pulses. This counter state is compared with an internal register that is programmable via this system bus, and this register determines—in accordance with the predetermined location of the trigger pulse in the signal to be displayed—how many digital interrogations of the input signal must still take place so that the expected signal train can be displayed completely, or which signal ranges are to be selected from the shift register for signal display (pre- or post-trigger). The counter state accordingly functions more or less as a pointer, the length of which determines the relative location of the trigger pulse at the beginning of the digital signal train that is to be selected for the display. Another dual time base is also contained in the component assembly 307, and the switchover of the time base takes place after the input of the trigger pulse. The switchover of the time base is effected via the connection with the programmable time control 304 via the BUS structure.

The programmable time base and the output signal SSP of the programmable timer also control a programmable data multiplex controller 308, which in turn, by multiplexing pulses, controls the signal processing direction of the cross-channel multiplexer 120 in accordance with a word loaded into a register via the system bus 160 and the interface 305. The internal transmission of the data words in the conversion processor 130 is effected via an internal bus 309. Data identifying the operating state of the conversion processor can also be read out of a state register 310. Via the interface 305, an internal signal is also derived, which controls the shift register 132. The programmable time control also emits pulses for triggering the flash converters 131 and 131'.

The conversion processor 130 also contains a programmable pulse generator 311, which triggers both some internal system pulses and, via a separating stage 134, the pulse generator output 136 of FIG. 1. For an external function, a counter 312 is also implemented inside the conversion processor ICs.

As the drawing shows, the entire time control for the signal recording is advantageously combined within the conversion processor, because for chronologically high-resolution signal processing this time control must proceed at high speed. Unless the various functions are combined in their own component assembly, the concept of the device according to the invention cannot be realized, and in this respect it should be noted that the spatial combination, that is, in three dimensions, also has considerable advantages in terms of signal transit times, and thus makes the desired high-speed processing attainable.

FIGS. 1 and 2 also show that the conversion processor in the exemplary embodiment shown delivers the signals originating in the flash converter 131 of only one channel via the buffer 310 (FIG. 3) to the shift register 132, and so performs the time control. The second channel, which is not responsible for the triggering and signal control, is processed bypassing the conversion processor 130, and the shift register 132' is connected directly to the output side of the flash converter 131'. This considerably simplifies the signal processing.

The digital trigger comparator is improved in terms of signal recognition by the provision that it can (programmably) compare two successive signal instants with one another, and by forming a difference, the slope can be ascertained and compared with a predetermined value, on the one hand, and on the other triggering is also possible whenever the varying input signal does not precisely attain the specified triggering level but instead jumps past it from one signal value to the next.

The function of the above-described circuits will now be explained in terms of still other aspects, with a view to the teaching of the invention:

One essential element in digital processing of analog signals is the analog/digital converter, because it is the interface between the analog portion and the digital portion. Analog/digital converters of various systems are already known. The analog/digital parallel converters that have been on the market for several years, however, for the first time enable a step toward much higher speeds than the previously used approximative converter systems and the other known principles of analog/digital conversion.

An analog/digital converter operating on the parallel converter principle quantizes the analog information by means of analog comparators staggered one above the other, with the comparator that responds being the one that corresponds to the analog signal amplitude value present at a given time. By means of discrimination and encoding circuits connected to the output side, the thereby quantized amplitude value is converted into a digital value. Based on this principle, analog/digital converter speeds of between 1 MHz and over 100 MHz are obtainable, depending on the technology used.

If a digitized datum were connected to the bus of a microcomputer system at the maximum speed of the high-speed shift register, then no computer would at present be in a position to process these signal train speeds, because microcomputer systems perform the analysis of the arriving digital signals sequentially, for example in cooperation with memory elements. As a result, a time problem arises at this interface. Thus while parallel analog/digital converters make it possible for the first time to evaluate very broad band analog signals, a time problem arises, which can be defined by the fact the information flow speed from the flash converter system cannot be processed by the microprocessor. This problem will be called the "time interface problem" herein.

This time interface problem is realizable only with an intervening data buffer. This data buffer would have to be embodied like a high-speed data memory. However, since the multifunctional demands made of a signal processor mean that this data buffering would again have to take place at different speeds and in accordance with different criteria, the high-speed data memory would have to have sufficiently large capacity so that afterward it would be able to evaluate the buffered information by means of the microprocessor in accordance with the different criteria. This would have two disadvantages. First, relatively large memories would have to be used, especially if relatively long signals and a high sampling rate are involved; and second, the microprocessor would need a correspondingly long time to analyze these data sequentially and work through them. This kind of procedure would also have the disadvantage that real-time evaluation could not be done, because the time interface problem still exists.

A first demand made of such a high-speed analog/digital converter processor, that is, the conversion processor, is for very high data throughput. Since analog/digital parallel converters are today capable of processing analog data faster and faster into a digital data flow and at the same time this high-speed data processing requires very high currents, that is, electrical power, the trend is toward integrated CMOS circuits.

The time interface problem requires intermittent operation. The term "intermittent" is understood in this context, however, to mean that at maximum conversion speed, the data are not required continuously; instead, they are called up, corresponding in number to the memory depth of the high-speed data buffer to be disposed in between, and the data flow is then interrupted. This kind of intermittent operation will always be required by system needs, nor can be circumvented even if it is possible for the data processing at the end of the data-processing chain, in this case for example the data-processing microprocessor, to take place more slowly than the speed of data recording. The ratio between high-speed data recording and the processing speed of the actual data processing is a direct expression of the maximum possible duty cycle of the intermittently operating system.

In a signal computer of the present type, this kind of intermittent operation takes place for instance if the sampling is done at 20 MHz and the intermediate data buffer has a capacity 512 bytes in length, for example.

The entire data buffer would thus be filled within a period of

512/20 MHz=25.6 μs.

However, if the data were required only every 1000 μs, then the duty cycle would be 25.6/1000=0.0256.

This concept has been presented first, to make it clear the advantages that CMOs technology would have in high-speed scanning, if the high-speed CMOS integrated circuits were initially designed such that a power consumption proportionate to this speed would take place only when the CMOS integrated circuits are clocked. It is known that CMOS technology has no advantage over TTL or ECL technology, when it is high-speed events that elapse continuously that are involved. With intermitted operation, however, during the unlocked time phases in CMOS integrated circuits only the leakage current is drawn; the power is thus a fraction of the power required at full clock speed.

From this, the following concept can be drawn: If a flash converter is to be clocked with the maximum speed in CMOS technology, then it needs the full power. On the other hand, if this clocking needs to happen for only a certain period of time, then its current consumption drops in an approximately linear ratio to the duty cycle. The same applies for all the controller and memory components, if they are constructed by CMOS technology.

For this reason, an intermittent sampling mode has been provided for the conversion processor. As a result, the conversion processor furnishes the CMOS flash converter with those particular sample pulses, in the particular order and with the particular duty cycle, that are required for the intermittent data pickup.

The general principle of controlled sampling will now be described, in terms of an exemplary embodiment:

As shown in the block circuit diagram, FIG. 3, the cross-channel multiplexer and its analog output are followed by the AD flash converter. Depending on its resolution, the encoded signals of the flash converter are delivered, for instance with an 8-bit width, to the input AD0–AD7 of the conversion processor (FIG. 2). The data selected by the conversion processor are delivered at its output Q0–Q7 to a high-speed register. This basic layout accordingly makes it possible for the analog signal, controlled by the conversion processor, to take samples intermittently or continuously by means of the flash converter; these samples are delivered to the shift register via the controlled buffer register of the conversion processor and temporarily stored there, until after quantizing by internal counters, the shift register has recorded the thus selected data. Via the for instance 8-bit-wide outputs of the shift register, the main microcomputer can then acquire the data words— which are temporarily stored in the manner of a stack register—from the shift register that provides the temporary storage, at the speed adapted to and determined by the shift register.

Nevertheless, the conversion processor has a number of other tasks to perform as well. The description of the conversion processor will be made by referring to the block circuit diagram of FIG. 3. The basic tasks that are to be performed by the conversion processor and that are taken as the point of departure are the following:

1. Since the conversion processor is supposed to control the flash converter in its sampling, and this sampling determines the instant and duration of the sample and hence chronologically quantizes the samples, the conversion processor must contain a time standard. Aside from other applications, in the application for an oscillograph it is quite clear in this connection that the lining up of acquired samples is nothing else than the horizontal base of an oscillograph, or—expressed in another way—the conversion processor must form the time standard and the selectable time base.

For its structural layout, this means that a quartz crystal must be present as the time standard, and the chronological sequence of the sampling rate and its order, that is, the sampling pulse trains that determine the time base, must be programmable.

2. This time base, preprogrammable in this manner, must control inquiry pulses in such a manner that depending on the requirements of the flash converter, pulses are generated from the conversion processor clock, which appear at the output of the conversion processor in accordance with the basic requirement of the time base and with the control program of the AD flash converter.

3. Furthermore, the conversion processor, in particular because of its function of being able to acquire signals in a preprogrammable manner from the flash converter and to perform a digital trigger recognition, must include an amplitude discriminator that is digitally presettable, or in other words is once again programmable, and in this case this is a programmable digital comparator. This digital comparator, in the case of the application as an oscillograph, provides the trigger function, while in the case of a generalized signal computer it can be used for analysis of the amplitudes.

4. As general tasks for the conversion processor, other functions should also be required, such as generating different time bases in accordance with the either the amplitude discriminator or presettable criteria, counting circuitry for monitoring the high-speed memories that follow, and generating typical signals for cooperating with the microprocessor, such as interrupt signals and other control signals.

5. Since this is a very fast digital processor, it would also be advantageous for other signals, for instance used for multiplex control, to be implemented.

The block circuit diagram shows all these functions of the complex controller. The fundamental time base is embodied by the quartz crystal (Q). The quartz crystal is incorporated in the oscillator via an inverting input buffer and an output driver and may for instance be designed in 2μ CMOS technology for 80 MHz. The basic clock of the time base, generated in this way, is delivered to the programmable pre-divider. Located at its input is a divider having following divider stages, which divides the clock 1 for instance by the following numbers:

1, 2, 4, 8, 20, 40 and 80.

These possible clock frequencies are switched via a multiplexer, which can be switched by the program, and following flip-flops in such a way that the clock frequencies needed to control internal processes in the conversion processor are available for example in the following graduation:

20, 10, 5, 2.5, 1 MHz and 500 KHz.

Also, this programmable pre-divider is configured such that—as indicated in the block circuit diagram—an external clock can additionally be supplied, which controls the conversion processor with a different fundamental clock, and at the same time the clock generated by the quartz oscillator is used, so as to drive the pulse generator via clock 3, or to be able to furnish the internally generated pulses of
10 MHz, 5 MHz, 1 MHz and 500 KHz
via five outputs, here identified in common with clock outputs.

Also furnished by the programmable pre-divider is a clock 2, which is made up of the 12-bit counter and a 4-bit counter, which in turn clocks the internal time control of the conversion processor. This time control comprises, first, a 12-bit multiplexable and presettable counter, and, second, a 4-bit multiplexable and presettable counter. Both counters operate via operating mode controls that can be determined by the program and adjusted by the multiplexer, so that at their outputs the sample-select pulse for selection control for the shift register, and at the same time the sample pulses, correlated with it, for the flash converter, are generated.

The sample pulses for the flash converter can be made programmable in a kind of burst pulse mode, depending on the specified operation of the flash converter, because there are flash converters that for acquiring a single pulse must be controlled with two to three, or for example five, pulses, in order to shift a sample from the input of the flash converter to its output. In contrast to this, however, the shift register needs only one clock pulse for this shifting, and in this way the correlation of the clock pulse with the sample pulse of the flash converter can in this way be performed in a chronologically correct manner and in accordance with the operating modes of the flash converter.

In this way, different flash converters and memory systems, and future ones not yet even defined by the market, can be selectably controlled by program; for example, flash converters made by NMOS technology are usually dynamically coupled, while a static coupling is typical for CMOS flash converters.

At the output of the programmable time control integrated circuit, the internal clock for the internal buffer, the programmable dual time base circuit, and the clock for the trigger position counter and the control clock for the programmable multiplex control integrated circuit are also generated (SSP). The SSP also clocks the programmable digital comparator. This complex programmable time control for the function units, which in their turn are also programmable, makes possible a highly variable sampling acquisition and high-speed memory control—which is necessary, for data analysis with different time bases.

The data flow is now processed by this time control, as follows:

The data controlled by the flash converter via the data bus AD 0–AD 7 by means of the sample pulse are delivered to the data buffer (register). This register, which in turn is controlled by the data selection pulses (SSP), passes the data that are sorted by this gate into the selected data data bus (marked "Selected Data") on via the output Q0–Q7 to the high-speed memory, in this case to a high-speed shift register.

The programmable digital comparator is also connected parallel to the selected data bus. This digital comparator has fundamental significance with the signal processing, because of the quartz oscillator. Via the internal program bus, this comparator can be preprogrammed in accordance with amplitude value and with the algebraic sign ($\pm$) of amplitude change. It serves in the digital portion for recognizing the amplitude-dependent data pattern, and for recognizing the algebraic sign of the data pattern change. In the analog signal portion, this equivalently means the recognition of a trigger threshold and of the differential algebraic sign of the analog data change.

Together with the analog/digital conversion controllable by the time base, this stage realizes a genuine digital trigger recognition, in accordance with the algebraic sign of the trigger edge and with the trigger amplitude.

Since the data recognized and discriminated in this way are then delivered to the temporary memory, it is thus possible here, in contrast to otherwise typical data pre-stored via CCD elements, for the trigger recognition to take place within the digital data flow furnished by the flash converter, and above all for this instant of recognition to be utilized for varying the internal time-dependent control courses in the conversion processor.

This kind of method makes extreme demands of the speed of the digital integrated circuits, demands that are on the leading edge of technology, if the goal is to be attained that at the instant of recognition of a data pattern, a reaction appropriate to the analysis and used for controlling all the other integrated circuits including the flash converter is to take place as early as the next sampling.

The complete trigger function can be described as follows:

By means of the main computer, the trigger amplitude, as a digital data pattern, is specified to the programmable digital comparator, in accordance with the resolution in bits, which is specified by the flash converter or the digital comparator.

Also, the trigger edge sign ($\pm$) is specified progressively, as the transition from the lower-order bit pattern to the higher-order bit pattern (positive trigger edge) or from the higher-order to the lower-order bit pattern (negative trigger edge).

It is also provided that the trigger edge sign may be indifferent; that is, that recognition may be recognized only on the basis of the trigger amplitude (trigger word).

For applications of the digital comparator as a logic analyzer, it is further provided that masking of individual bits is possible, so that together, every arbitrary criterion can be prescribed, along with the other discriminating specifications, for bit pattern recognition; in the final analysis, this means that the programmable digital comparator is capable of recognizing arbitrary bit patterns and of analyzing their chronological position.

The thus-recognized chronological positions of the selectively programmable and recognized bit pattern positions are available at the output of the digital comparator. They are delivered to the programmable trigger position counter, which at the same time acts as a programmable counter for the second time base.

Furthermore, by means of the main computer and its data and address bus, and via the microcomputer interface of these trigger position counters that is located in the conversion processor, the trigger position is also fixed chronologically in a programmable manner in relationship with the memory capacity of the high-speed shift register.

Since the digital trigger amplitude point, its edge criterion and the instant of the trigger point have now been prescribed by the main computer, the high-speed shift register can now be filled with the chronological information extract in such a way that the trigger point is positioned in accordance with the specifications of the main computer.

From the standpoint of the overall system, this means that the replication of the chronological course of the information is stored in the high-speed shift register as a function of the trigger point that is preselectable in accordance with amplitude and instant in time. It is thereby attained that the conversion processor is capable of replicating an information extract (intermittent operation) information arbitrarily in accordance with instant in time and/or amplitude.

If this conversion processor is for instance used inside an oscillator, then in the terminology of the oscillator this means that the trigger, after the analog/digital conversion, is freely selectable in the digital portion of the signals in accordance with time and amplitude and accordingly can always be found and positioned fully automatically, in the form of a so-called pre-or post-trigger.

If the programmable trigger position counter is positioned in such a way that it is sufficiently large in terms of its counter capacity, then the chronological extract can also be selected by suitably large high-speed buffer memories.

The programmable position counter can also distinguish between a normal trigger and an auto-trigger, depending on the conditions set by the main processor; in normal trigger operation, it reports the completed recording to the main computer only once the preset trigger point has been found, while in auto-trigger operation it also makes recorded pictures available even if no trigger point has been found.

Furthermore, the programmable trigger position counter is embodied such that control is preformed by digital criteria or clock plus counting specifications of the shift register, instead of by amplitude criteria, and that furthermore an arbitrarily presettable number of sample recordings can be made and the recording then stopped until the arrival of new recording criteria.

This leads to trigger types that thus far have not been used in oscillographs. Naturally, a mode of operation can also be selected where without amplitude criteria, a recording can be made up to the maximum capacity of the high-speed memory (rolling operation).

The block circuit diagram also shows that in addition to the digital comparator connected parallel to the selected data bus, these data can also be made available to the data bus of the main microcomputer directly, via the microcomputer interface.

This information route represents a bypassing of the conversion processor, and leads for example, with correspondingly slowly controlled sample recording, to constant real-time operation with the data deriving from the flash converter.

Here, it is possible to attain, among others and to name only one example, a constant inquiry with a corresponding sample train frequency, where the main microprocessor can process this data train speed. This data traffic can even be bidirectional; that is, the microprocessor could in its turn also write data into the shift register, via its bus and via the internal interface in the conversion processor.

This particular mode of operation leads to a highly interesting application of the function reversal of the high-speed shift register. Data trains generated in the main computer or deriving from its memory can for instance, via the interface, be written slowly into the high-speed shift register, and then at its output these data, clocked with a high frequency, can be delivered to a high-speed digital/analog converter, which in turn could once again generate a high-speed analog signal. For the application to an oscillator under discussion here, this reversal has an unusual outcome.

With the aid of the control of the conversion processor, information recorded via the analog/digital converter and stored in the memory of the main computer is, after an arbitrary storage period, read out once again in the form of high-speed analog information via the digital/analog converter; in this case the high-speed shift register now performs data buffering in the opposite direction.

The circuit unit that contains the programmable trigger position counter is at the same time embodied such that it can also function as a programmable counter for the second time base during the scanning. In principle, in so doing it performs the same tasks. While the sampling rate that is to be used for the scanning provided for the second time base is being programmed into the programmable time control integrated circuit, the instant of time (that is, position in the shift register) at which the second time base is to come into action and-/or optionally be stopped is being programmed into the programmable counter for the second time base—in a manner similar to that for the trigger position. The counter is clocked in synchronism with the central programmable time control integrated circuit, and in turn sends the counter result as a report, in the form of a pulse, back to the central programmable time control integrated circuit. At the same time, this pulse travels to the programmable multiplex control. This control in turn, after the end of the entire inquiry, trigger position and counter operation for the second time base, generates a general stop pulse for the definitive shutoff of the entire inquiry cycle for the contents of one shift register, so that then, with the pipeline-like shifting of the sequentially written data words into the shift register, every additional datum that could arise as a result of pulse edges or other course-related events, is uniquely defined as an end-of-inquiry cycle.

The multiplex control is likewise programmable. First, for example for the "alternate" and "chopped" operating modes, or for signal-channel operation, it generates the corresponding multiplex switching signal and its inverted signal. With these signals MX and $\overline{MX}$, the cross-channel multiplexer can be controlled in all the operating modes described.

Similarly, based on the trigger recognition pulse furnished by the programmable digital comparator for the trigger types in which the trigger source is something other than the channel to be called up and recorded, the multiplexer integrated circuit can generate the multiplexer switchover signal, which first keeps the multiplexer switch on the trigger source channel, until the trigger amplitude has been recognized, and then switches the switch over to the channel to be called up.

The integrated circuit also has a shift register output enable signal, which is controlled by the microcomputer interface and can be used to control the tristate output of the shift register.

In order to make still further use of the highly integrated high-speed conversion processor, additional functions besides the control circuits for the flash converters that have already been described are built in, and these may be used for other purposes of the surrounding electronic circuitry.

A pulse generator is provided, which can generate burst pulse trains in a programmable manner by frequency and order. Derived from the quartz oscillator and the programmable predivider, the pulse generator, which in turn is programmable, is built in via clock 3. By division of the furnished frequencies, it can furnish at its four outputs the thus-programmed pulse package via driver stages to the outputs of the integrated circuit as follows:

(1) the burst pulse output (generator output);
(2) the trigger pulse for the duty cycle of the burst generator;
(3) the generator clock, as the basic frequency of the individual burst pulses;
(4) the generator burst clock, as the ratio of the duty cycle of the total burst pulse duration to the total burst pulse package duty cycle.

Also provided in the device is a divider, which enables dividing signals applied from outside via Counter Clock by 64 and sending them back outside as Counter Output. Via the Counter Reset input, the counter can be reset asynchronously.

The integrated circuit also has a shift register output enable signal output, which is controlled by the microcomputer interface and can be used to control the tristate output of the shift register.

The conversion processor thus represents an integrated circuit that enables controlling a flash converter with different inquiry trains in the so-called intermittent mode, selecting the data furnished by the flash converter, and recognizing the bit pattern furnished. It can deliver these selected data to a following high-speed memory element in order to use this element optimally. It can control the following memories directly in this manner, as long as they are designed in the form of shift registers. It makes the shift frequency available and via internally programmable counters can determine the position of the data in the shift register. It also has an internal status register, which is readable by the microcomputer directly and by way of which the interrupt or trigger report, for example, or the entire internal status, can be called up and also tested.

In this sense, this bidirectional bus connection is used by the main processor externally for writing in data and conversely it can be used for recognizing the program status as well as for testing the integrated circuit.

The invention is not restricted in its scope to the above-described preferred exemplary embodiment; instead, a number of variants is conceivable, which even with fundamentally different embodiments may make use of the principle described herein.

I claim:

1. A signal processing device, comprising:
   at least one input for receiving analog input signals,
   a shift register,
   an analog/digital converter receiving said analog signal and producing an output signal which is a digital signal train, and
   a processor comprising a memory for processing said digital signal train forming said output signal of said analog/digital converter, said digital signal train representing said analog signal that is to be displayed in a display field, said shift register being a digitally operating high-speed shift register and being connected to receive said output signal from said analog/digital converter,
   an input control means for controlling said analog/digital converter and said high-speed shift register, said input control means producing a data selection pulse and including a timer,
   means for storing said digital signal from said shift register in said memory, said means for storing being controlled by a data selection pulse from said input control means,
   said input control means being a separately programmable and separately timed control module.

2. A signal processing device as defined by claim 1, wherein said timer has an internal programmable register and a programmable time control circuit which, in response to control signals at its input emits a clock signal having a train frequency that is determined by the contents of said internal programmable register.

3. A signal processing device as defined by claim 2, wherein said oscillator supplies signals to a programmable prescaler for scaling the frequency of the output pulses of said timer, wherein said output pulses of said programmable prescaler form the input signals of said programmable time control circuit.

4. A signal processing device as defined by claim 2, wherein said analog/digital converter for the input signal is triggered by said clock signal of said time control circuit for taking of a signal sample.

5. A signal processing device as defined by claim 4, wherein said analog/digital converter is a flash converter, optionally necessary preliminary pulses being formed by means of said clock signal, said preliminary pulses being delivered solely to said analog/digital converter with a necessary pulse number.

6. A signal processing device as defined by claim 1, wherein said timer has its own oscillator.

7. A signal processing device as defined by claim 1, wherein said control module has an internal BUS for data, address and control signals, which is connected to said processor.

8. A signal processing device as defined by claim 7, wherein said interface communicates via said external BUS structure with an internal bus structure having data lines for transmitting data.

9. A signal processing device as defined by claim 1, wherein said control module further comprises a digital comparator for comparing the digitized input signal and a digitally specifiable comparison signal, said digital comparator being triggerable by said data selection pulse for performing one comparison operation at a time, wherein upon agreement of said digitized input signal and said digitally specifiable comparison signal, said comparator emits an output signal indicating said agreement.

10. A signal processing device as defined by claim 9, wherein said comparator is connected to the output side of said data buffer.

11. A signal processing device as defined by claim 9, wherein said comparison signal for said comparator is specifiable by programming of said control module by a digital signal transferred to a selected register.

12. A signal processing device as defined by claim 9, wherein in response to said output signal of said digital comparator, a trigger signal for the display of a selected signal course in the display field is released.

13. A signal processing device as defined by claim 9, wherein said digital comparator emits an output signal indicating the agreement of said input signal and said comparison signal, the signal at the output of said shift register being one of (a) equal to said specified signal and (b) said specified signal is located in the range between a value corresponding to the associated analog amplitude of the current digital signal at the output of said shift register and the value of the corresponding preceding signal.

14. A signal processing device as defined by claim 9, further comprising a programmable trigger position counter connected to the output side of said comparator, which by programming is settable into a predetermined status wherein said programmable trigger position counter can be caused to count upward or downward by means of said clock signal of said time control circuit, and wherein said programmable trigger position counter emits an output signal whenever a specified counter status is attained, which deactivates the programmable time control.

15. A signal processing device as defined by claim 9, wherein with at least two-channel signal processing, only the signal of an input channel is delivered to said digital comparator and, while the input of the at least one other channel is processed directly, wherein the respective analog/digital converter is likewise triggered by the clock signal of the control module.

16. A signal processing device as defined by claim 1, further comprising a programmable control unit for a multiplex circuit which emits pulses in response to said data selection pulse in a programmable association as a function of the data contents of an internal register, to a cross-channel multiplex circuit, which as a function of these pulses operates in one of a plurality of modes, said modes including chopped, single channel, and chronologically alternating with at least the input of at least one digital/analog converter.

17. A signal processing device as defined by claim 1, wherein the timer of said control module is programmable by a data word transferred from another signal source.

18. A signal processing device as defined in claim 1, further comprising at least one of an additional programmable pulse generator and a function generator.

* * * * *